(12) United States Patent
Hai et al.

(10) Patent No.: US 11,156,664 B2
(45) Date of Patent: Oct. 26, 2021

(54) SCAN CHAIN TECHNIQUES AND METHOD OF USING SCAN CHAIN STRUCTURE

(71) Applicant: SK hynix Inc., Gyeonggi-do (KR)

(72) Inventors: Yisu Hai, San Jose, CA (US); Jonguk Song, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 82 days.

(21) Appl. No.: 16/657,535

(22) Filed: Oct. 18, 2019

(65) Prior Publication Data
US 2020/0132767 A1    Apr. 30, 2020

Related U.S. Application Data

(60) Provisional application No. 62/753,194, filed on Oct. 31, 2018.

(51) Int. Cl.
*G01R 31/3185* (2006.01)
*G01R 31/3177* (2006.01)
*G11C 29/32* (2006.01)
*G11C 29/18* (2006.01)

(52) U.S. Cl.
CPC .. *G01R 31/318536* (2013.01); *G01R 31/3177* (2013.01); *G01R 31/31853* (2013.01); *G01R 31/318597* (2013.01); *G11C 29/32* (2013.01); *G11C 2029/1806* (2013.01); *G11C 2029/3202* (2013.01)

(58) Field of Classification Search
CPC .... G01R 31/318536; G01R 31/318597; G01R 31/3177; G01R 31/31853; G11C 29/32; G11C 2029/1806; G11C 2029/3202; G11C 29/50; G11C 29/18
See application file for complete search history.

(56) References Cited

U.S. PATENT DOCUMENTS

| | | | |
|---|---|---|---|
| 6,795,948 B2 | 9/2004 | Lin et al. | |
| 8,522,097 B2 | 8/2013 | Kim et al. | |
| 10,417,363 B1* | 9/2019 | Kaur | G01R 31/318575 |
| 2009/0119559 A1* | 5/2009 | Foutz | G06F 11/267 |
| | | | 714/729 |
| 2018/0128876 A1* | 5/2018 | Fel | G01R 31/318563 |

OTHER PUBLICATIONS

M. E. J. Obien, S. Ohtake and H. Fujiwara, "Constrained ATPG for functional RTL circuits using F-Scan," 2010 IEEE International Test Conference, Austin, TX, USA, 2010, pp. 1-10. (Year: 2010).*

* cited by examiner

*Primary Examiner* — Cynthia Britt
(74) *Attorney, Agent, or Firm* — IP & T Group LLP

(57) ABSTRACT

Testing systems and method of testing an integrated circuit are provided. A testing system comprises an input terminal, multiple circuit elements, each having a register, and an output terminal forming a scan chain through which an input signal is propagated. The testing system further comprises a debugger that includes a mapping module that stores information mapping register values to their respective functional meanings. The input signal is applied to extract all values of all of the registers whether or not accessible by a processor.

14 Claims, 5 Drawing Sheets

SCAN CHAIN TECHNIQUES AND METHOD OF USING SCAN CHAIN STRUCTURE

CROSS-REFERENCE TO RELATED APPLICATION

This application claims the benefit of U.S. Provisional Application No. 62/753,194, filed Oct. 31, 2018, the entire content of which is incorporated herein by reference.

BACKGROUND

1. Field

Embodiments of the present disclosure relate to scan chain techniques to improve testing integrated circuits (ICs).

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Memory systems typically contain components, many of which include ICs. For example, an SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

ICs in memory systems, as well as in other electronic systems, are tested to ensure that they function properly. Scan chain is a technique commonly used in design for testing/testability (DFT). Scan in and scan out define the input and output of a scan chain. When a scan enable signal is asserted, every flip-flop (FF) in the design is connected into a long shift register. A clock signal is used for controlling all FFs in the chain during shift and capture phases. A pattern is entered into the chain of FFs, and the state of every FF is read out.

When debugging a functional issue of a chip in the lab, typically the more registers in the design that can be accessed the better. However, usually not all registers in the design are accessible by the central processing unit (CPU). For example, an internal state machine state or counter value, which the designer believes is unnecessary to provide CPU access, may not be CPU accessible.

In this context embodiments of the present invention arise.

SUMMARY

Aspects of the present invention include systems and methods for implementing scan chain techniques.

In one aspect, the invention entails a testing system comprising an input terminal, a plurality of circuit elements, each having a register, and an output terminal forming a scan chain through which an input signal is propagated; and a debugger that includes a mapping module that stores information mapping register values to their respective functional meanings. The input signal is applied to extract all values of all of the registers whether or not accessible by a processor.

In another aspect, the invention entails a system comprising a computer, including a mapping module, configured to apply an input signal to a scan chain and to receive an output of the scan chain; and an integrated circuit including a plurality of combinatorial logic elements of the scan chain. The mapping module is configured to capture at least one value of each of the plurality of combinatorial logic elements whether or not accessible by a processor.

In another aspect, a method of testing an integrated circuit including a plurality of circuit elements, each having a register storing a value is provided. The method comprises generating mapping information identifying each of the plurality of circuit elements in terms of a hierarchical position within the integrated circuit; propagating an input signal through the plurality of circuit elements to form a scan chain; receiving an output signal containing the values of the plurality of registers of the scan chain; and correlating a position of each of the values in the output signal to its functional meaning using the mapping information. All of the values of all of the registers are obtained whether or not accessible by a processor.

Additional aspects of the present invention will become apparent from the following description.

DETAILED DESCRIPTION

Figure 1:
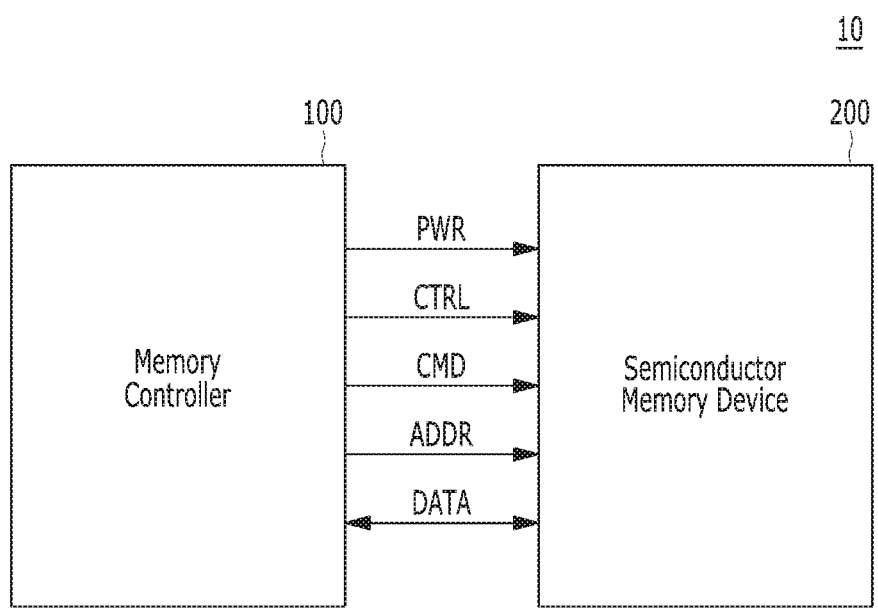
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrases are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type. The memory controller 100 and the semiconductor memory device 200 may sometimes be referred to below as simply controller 100 and memory device 200, respectively.

The controller 100 may control overall operations of the memory device 200.

The memory device 200 may perform one or more erase, program, and read operations under the control of the memory controller 100. The memory device 200 may receive a command CMD, an address ADDR and data DATA through input/output (I/O) lines. The memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated into a single semiconductor device such as a solid state drive (SSD), The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as any of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
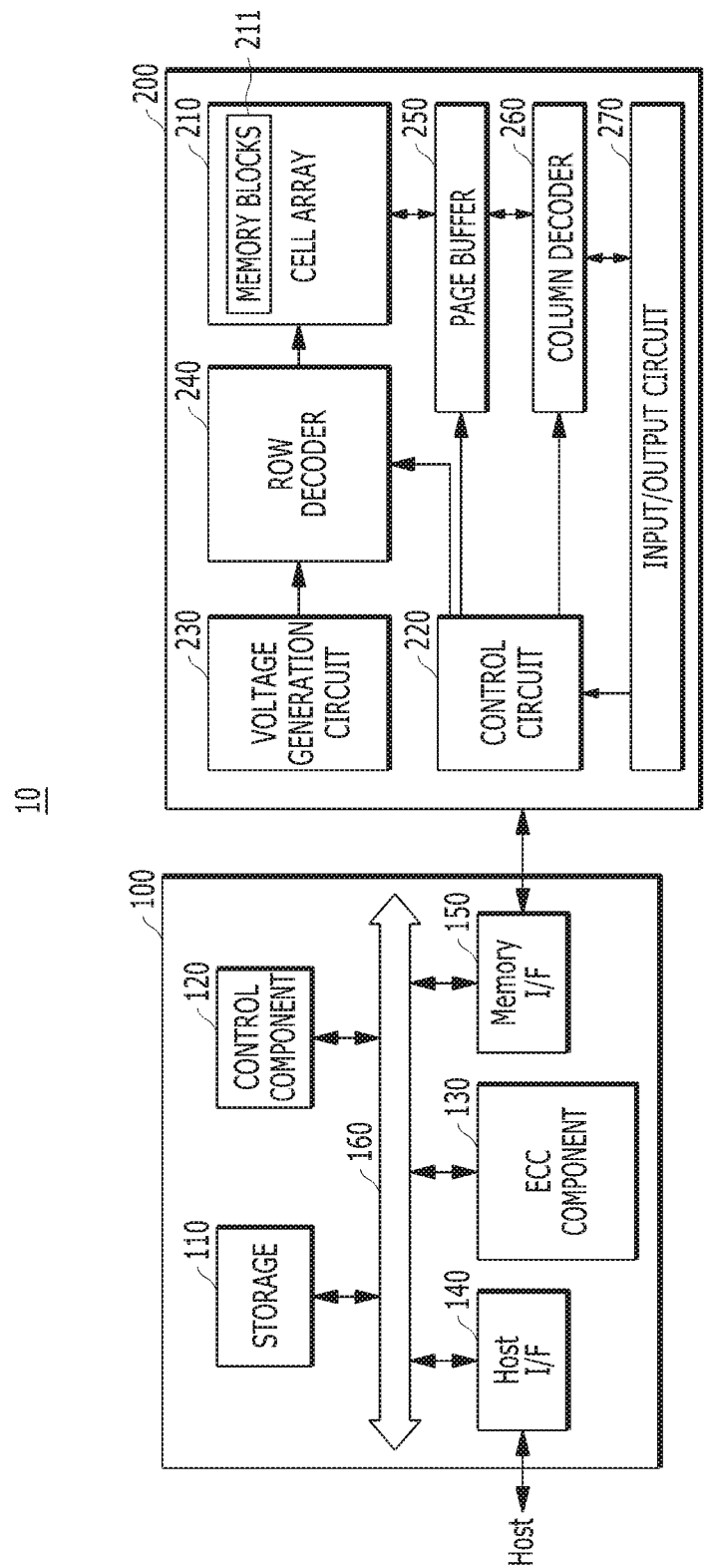
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The memory controller 100 may control storage of data in the memory device 200. For example, the memory controller 100 may control the memory device 200 in response to a request from the host device. The memory controller 100 may provide data read from the memory device 200 to the host device, and may store data provided from the host device into the memory device 200.

The memory controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the memory controller 100, and store data for driving the memory system 10 and the memory controller 100. When the memory controller 100 controls operations of the memory device 200, the storage 110 may store data used by the memory controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In embodiments, the ECC component 130 may perform an error correction operation based on a coded modulation such as a low-density parity-check (LDDC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
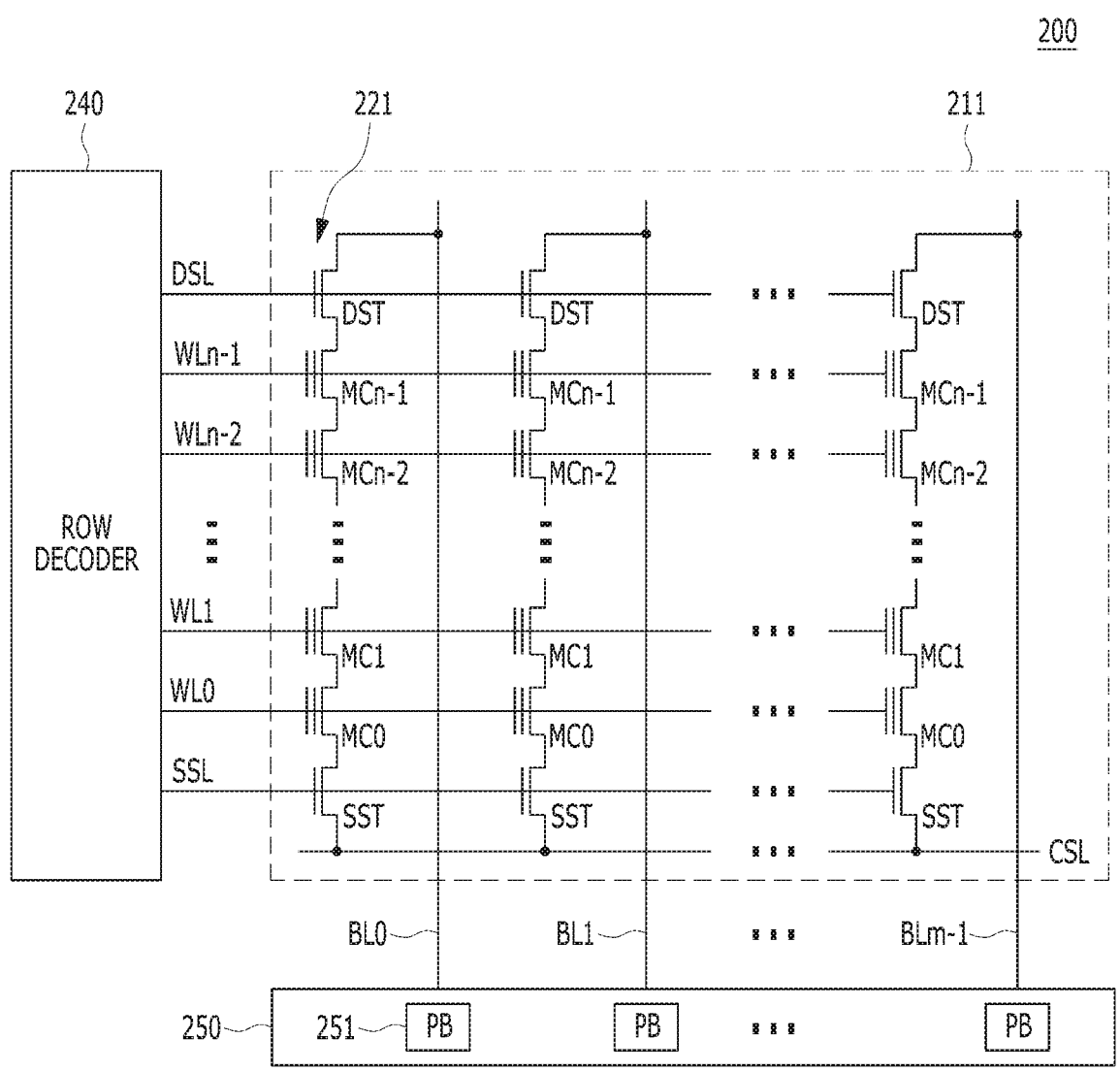
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1 The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selectiontransistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

The memory systems described above with reference to FIGS. 1-3 are examples of an electronic system having ICs that are subject to testing during design. Embodiments of the present invention may be applied to any suitable IC in any type of electronic system.

In connection with such testing, a scan chain for DFT is used to verify all flip-flops (FFs) and combinational logic gates (collectively, combinatorial logic elements or circuit elements) are working as expected. However, even if all such elements inside a chip are working as expected, that is, logically each is behaving as specified by register-transfer level (RTL) design, functional bugs in the RTL or firmware are still encountered during chip development, which means that the values of some combinatorial logic elements are not correct in some cases. When debugging such issue, as much information as possible is needed from the design at the failing point or node.

Aspects of the present invention address this issue. Embodiments of the present invention provide techniques for utilizing a scan chain structure to extract all register values, and using a mapping table to show the functional meaning of the bit stream shifted out through the scan chain. This is done even for registers that are not accessible by the CPU through a system bus, e.g., bus 160 of FIG. 2.

When a scan chain is created on a netlist of a design, design hierarchical and register name information is provided for every flip-flop in the scan chain. So, a simple map of the index of a bit stream position to its design functional meaning, i.e. its design hierarchical name, may be created. When a particular register value is needed, scan enable may be turned on to shift out all flip-flop values through the scan chain, and according to the mapping information previously created, it is possible to find out which bit(s) in this bit stream is/are the register value(s) needed.

Figure 4:
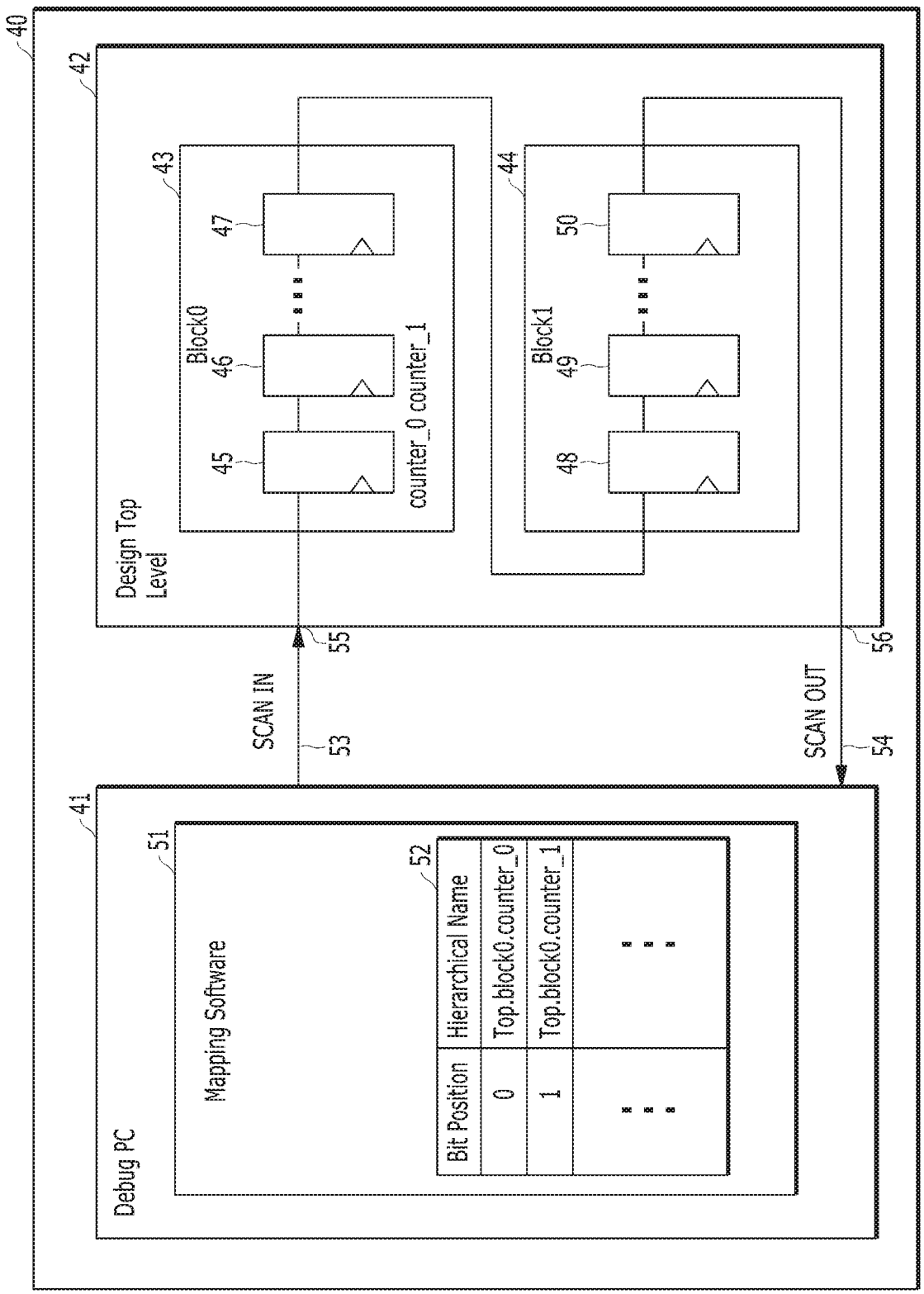
FIG. 4 is schematic diagram illustrating a testing system in accordance with an embodiment of the present invention.

FIG. 4 illustrates a testing system 40 that includes a device used for debugging 41, e.g., a debugger or debug PC, and a top level circuit design representation 42 with multiple blocks, i.e., Block0 43 and Block1 44, respectively. In the illustrated circuit design, Block0 43 includes three flip-flops (FFs) 45, 46 and 47 chained in series. Another block Block1 44 also includes three FFs 48-50. A first FF 48 of Block1 44 immediately follows FF 47 in the chain followed by FFs 49 and 50 of Block1 44.

Mapping module 51, which may be in the form of software, is running on the debug device 41 which maintains a mapping table 52 containing mapping table information. In the illustrated embodiment, the mapping table information includes a mapping of bit positions and respective hierarchical names, from which corresponding respective functional meanings can be understood by the chip designer, as shown in FIG. 4.

Scan in signal 53, embodying a pattern or input vector, is asserted by the debug device 41 through an input terminal 55 of element 42 that is connected to the first FF 45 in the scan chain. When a scan enable signal is asserted, scan in signal 53 is applied to FF 45 and propagated through all FFs in the chain, i.e., FFs 45-50 in the illustrated embodiment, to shift out all values of those FFs, which are transmitted via scan out signal 54 through an output terminal 56 of element 42 to the debug device 41. These values are entered into the mapping table 52 mapped to their functional meanings.

In the example shown in FIG. 4, there is a two-bit counter represented by FFs 45 and 46, which are not accessible through the system bus, but their values in a chip fail scenario are useful to a designer to identify the root cause of the bug. In this case, the chip can be flipped from functional mode to scan mode when the fail occurs, and all register values can be shifted out as a bit stream through the scan chain. In the mapping table 52, of the bit stream shifted out through the chain, bit positions [1:0] are grouped together as a 2-bit counter value of interest. The chip designer can use this information to get the counter value of interest through the shifted out bit stream to debug the chip.

In another embodiment, the mapping software 52 may include multiple mapping tables to accommodate different blocks of FFs that may be chained separately. That is, there may be one mapping table for each block. Thus, in the embodiment of FIG. 4, there may be two mapping tables, one for Block0 43 and the other for Block1 44. So, when the scan mode is initiated different mapping tables may be used to obtain registered hierarchical information for the respective bits of FFs of the respective blocks.

If there are security concerns, a secure Joint Test Action Group (JTAG) interface to switch each scan chain into and out of scan mode.

Figure 5:
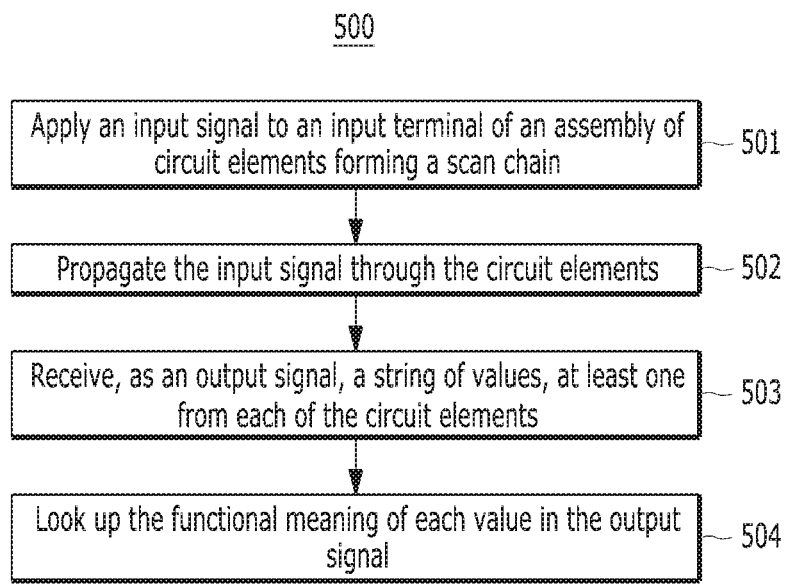
FIG. 5 is a flow chart illustrating steps for scan chain flow in accordance with embodiments of the present invention.

The scan chain flow in accordance with embodiments is illustrated in flow chart 500 shown in FIG. 5. The flow is described primarily with reference to FIG. 5 and secondarily with reference to FIG. 4.

In step 501, an input signal is applied to an input terminal of an assembly of circuit elements forming a scan chain. Thus, as shown in FIG. 4, the input signal 53 is applied to input terminal 55 connected to the first FF 45 in the scan chain of FFs.

In step 502, the input signal is propagated through the circuit elements, e.g., FFs, of the scan chain. This may be done by applying a scan enable signal to turn on scan mode to shift out all values of all circuit elements through the scan chain.

In step 503, an output signal is received by the debug device 41. The output signal contains a string of values, at least one from each of the circuit elements. These values are added to mapping table(s) running on the debug device 41.

Next, in step 504, a look up operation is performed. That is, functional meaning of each value can be determined from the mapping table(s) by correlating a position of each of the values in the output signal to its functional meaning. Advantageously, all of the values of all of the registers are obtained whether or not accessible by a processor.

The steps shown in flow chart 500 are exemplary. Those skilled in the art will understand that additional and/or alternative steps may be performed, or that the order of steps may be changed, to effectuate aspects of the present invention without departing from the inventive concepts disclosed herein.

As the foregoing demonstrates, embodiments of the present invention provide techniques for extracting all register values of all flip-flops or other logic elements linked in a scan chain, even for registers to which a processor, e.g., a CPU, does not have access. Thus, the present invention improves testing and debugging processes, such as DFT.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A testing system comprising:
a scan chain including an input terminal, a plurality of circuit elements and an output terminal, each circuit element having a register, the scan chain configured to propagate an input signal through the registers of the plurality of circuit elements, propagation of the input signal to generate register values of the registers that are to be output from the output terminal; and
a debugger that is configured to store mapping information, the mapping information including register values that correspond to respective functional meanings, wherein the register values in the mapping information correspond to the register values output from the scan chain, and wherein the input signal is applied to extract the register values of all of the registers in the scan chain, including one or more registers in the scan chain which are not accessible by a processor.

2. The testing system of claim 1, wherein the plurality of circuit elements include a plurality of flip-flops.

3. The testing system of claim 2, further comprising an integrated circuit that includes the plurality of flip-flops.

4. The testing system of claim 1, wherein:
the mapping information is stored in a mapping table, and
the mapping table including an index for positions of the register values of the registers in the scan chain and an index for relating the functional meanings to the register values at corresponding ones of the positions.

5. The testing system of claim 4, wherein the functional meaning index includes, for each register value in the position index, information identifying a block and a circuit element of the plurality of circuit elements including the register corresponding to said each register value.

6. The testing system of claim 1, wherein respective subsets of the plurality of circuit elements are embodied in respective blocks, and the mapping information includes multiple mapping tables, one for each of the blocks.

7. The testing system of claim 1, wherein:
the scan chain is in a semiconductor device to be tested by the testing system, and
the one or more registers in the scan chain which are not accessible by a processor are the registers that are not accessible by the processor through a system bus.

8. A system comprising:
a computer including a storage area configured to store mapping information and configured to apply an input signal to a scan chain and to receive an output of the scan chain; and
an integrated circuit including a plurality of combinatorial logic elements of the scan chain each combinatorial logic element storing a register value; wherein the output of the scan chain includes at least one register value of each of the plurality of combinatorial logic elements generated by the input signal, whether or not accessible by a processor, and wherein the computer is to compare the at least one register value of each of the plurality of combinatorial logic elements to the mapping information.

9. The system of claim 8, wherein the plurality of combinatorial logic elements includes a plurality of flip-flops.

10. The system of claim 8, wherein the mapping information includes a mapping table with an index for bit positions corresponding to the plurality of combinatorial logic elements and an index for a functional meaning of the at least one register value of each of the combinatorial logic elements.

11. A method of testing an integrated circuit including a plurality of circuit elements forming a scan chain, each circuit element having a register storing a register value, the method comprising:
generating mapping information identifying each of the plurality of circuit elements in terms of a hierarchical position within the integrated circuit;
propagating an input signal through the plurality of circuit elements of the scan chain;
receiving an output signal containing the register values of the plurality of circuit elements of the scan chain; and
correlating a position of each of the register values in the output signal to a functional meaning using the mapping information; wherein the register values of all of the circuit elements in the scan chain are obtained, including one or more circuit elements in the scan chain which are not accessible by a processor.

12. The method of claim 11, wherein the mapping information is maintained in a mapping table.

13. The method of claim 12, wherein the mapping table has an index for positions of the register values as extracted and an index for functional meanings corresponding to the register values at corresponding ones of the positions.

14. The method of claim 13, wherein the functional meaning index includes, for each register value in the position index, information identifying a block and a circuit element of the plurality of circuit elements in which the register associated with said each register value is embodied.

* * * * *